(12) United States Patent
Calvez

(10) Patent No.: US 7,885,802 B2
(45) Date of Patent: Feb. 8, 2011

(54) METHOD OF SIMULATING A COMPLEX SYSTEM INCLUDING SCHEDULER HIERARCHY, AND CORRESPONDING STORAGE MEANS AND COMPUTER PROGRAM PRODUCT

(75) Inventor: Jean-Paul Calvez, La Chapelle sur Erdre (FR)

(73) Assignee: Cofluent Design, Nantes (FR)

( * ) Notice: Subject to any disclaimer, the term of this patent is extended or adjusted under 35 U.S.C. 154(b) by 310 days.

(21) Appl. No.: 11/815,829

(22) PCT Filed: Feb. 7, 2006

(86) PCT No.: PCT/EP2006/050725

§ 371 (c)(1),
(2), (4) Date: Apr. 29, 2008

(87) PCT Pub. No.: WO2006/084845

PCT Pub. Date: Aug. 17, 2006

(65) Prior Publication Data

US 2008/0228461 A1      Sep. 18, 2008

(30) Foreign Application Priority Data

Feb. 14, 2005  (FR) .................................. 05 01486

(51) Int. Cl.
*G06G 7/62*     (2006.01)
*G06F 17/50*    (2006.01)
(52) U.S. Cl. .......................................... 703/17; 703/14
(58) Field of Classification Search .................... 703/14, 703/17
See application file for complete search history.

(56) References Cited

U.S. PATENT DOCUMENTS 7,069,204 B1 *   6/2006   Solden et al. ................. 703/14

(Continued)

FOREIGN PATENT DOCUMENTS

WO         02/27565  A1      4/2002

OTHER PUBLICATIONS

Bouchhima et al. Fast and Accurate Timed Execution of High Level Embedded Software using HW/SW Interface Simulation Model, 2004, Proceedings of the 2004 Asia and South Pacific Design Automation Conference, pp. 469-474.*

(Continued)

*Primary Examiner*—Paul L Rodriguez
*Assistant Examiner*—Aniss Chad
(74) *Attorney, Agent, or Firm*—David D. Brush; Westman, Champlin & Kelly, P.A.

(57) ABSTRACT

A method is provided for simulating a complex system including a scheduler hierarchy. The complex system includes at least one processor that executes a set of functions under the control of a hierarchical group of schedulers. The method includes a step of constructing an architectural model of the complex system comprising a hierarchical group of components, each of said components comprising an instance of an object class belonging to the group containing: a first class, known as the Processor class, which represents an abstract model of any processor included in the complex system, a second class, known as the Function class, which represents an abstract model of any function executed by the complex system; and a third class, known as the Scheduler class, which represents an abstract model of any scheduler. Each instance is initialized with at least one attribute that characterizes the behavior desired therefrom.

12 Claims, 5 Drawing Sheets

U.S. PATENT DOCUMENTS 7,567,893 B2 *   7/2009   Torossian et al. ............. 703/16

OTHER PUBLICATIONS

Bouchhima et al. Using Abstract CPU Subsystem Simulation Model for High Level HW/SW Architecture Exploration, Jan. 2005, Proceedings of the 2005 Asia and South Pacific Design Automation Conference, pp. 969-972.*

International Search Report from International application No. PCT/EP2006/050725 dated Feb. 8, 2006.

Le Moigne et al., R., "A Generic RTOS Model for Real-Time Systems, Simulation with SystemC", proceedings of the Design, Automation and Test in Europe Conference and Exhibition Designers' Forum, vol. 3, pp. 82-87, Feb. 2004.

Muller et al., F., "An Interactive Modeling and Generation Tool for the Design of Hw/Sw Systems", proceedings of Euromicro Conference, vol. 1, pp. 382-385, Sep. 1999.

Perrier, V., "System architecting complex designs", Embedded Systems Europe, pp. 24-26, Jan. 2004.

Yoo et al., S., "Automatic Generation of Fast Timed Simulation Models for Operating Systems in SoC Design", proceedings of the 2002 Design, Automation and Test in Europe Conference and Exhibition, pp. 620-627, Mar. 2002.

* cited by examiner

METHOD OF SIMULATING A COMPLEX SYSTEM INCLUDING SCHEDULER HIERARCHY, AND CORRESPONDING STORAGE MEANS AND COMPUTER PROGRAM PRODUCT

CROSS-REFERENCE TO RELATED APPLICATION

This Application is a Section 371 National Stage Application of International Application No. PCT/EP2006/050725, filed Feb. 7, 2006 and published as WO 2006/084845 on Aug. 17, 2006, not in English.

FIELD OF THE DISCLOSURE

The field of the disclosure is that of complex systems of the type that includes at least one processor executing a set of functions under the control of a hierarchised set of schedulers.

The term processor is taken in the present document to mean any execution resource unit. The disclosure is not restricted only to the software and hardware processors used in electronics and computer systems, but also applies to mechanical processors (for example a robot which executes one or more tasks) or human processors (for example an operator who executes one or more tasks).

Furthermore, in the present document, the term scheduler is taken to mean a function capable of establishing an order for the execution of functions or tasks for a processor used as a resource. This function may be implemented in software and/or hardware form, for hardware and software processors, or by any other technique for the other types of processors (mechanical and human).

These complex systems make it possible in particular, but not exclusively, to run computer programs, also known as applications or software.

To be more precise, the disclosure relates to a technique for simulating a complex system of this kind. In other words, the technique of the disclosure relates to the design and exploration of complex systems architectures.

The technique of the disclosure was developed for studying complex electronic systems architectures, whether these be cards or "System-on-Chip" (SoC) systems. These systems systematically integrate hardware and software.

However, given that the technique of the disclosure is based on general concepts of task (function), processor (and therefore execution resource) and scheduler, it has a wider application than that of microprocessors. It covers any type of processor (see the definition above) that has to sharing resources.

The technique of the disclosure is meant to be especially adapted to the new telecommunications and multimedia technologies. Developing standards and their gradual stabilisation are producing a need for the creation of extensible and therefore "remotely configurable" equipment. Dynamic configuration and therefore dynamic scheduling are solutions that provide a response to developments in product functionalities.

In electronic and computer systems, complex systems are implemented by assembling hardware components, with standard processors (or CPU, standing for "Central Processing Units"), microprocessors (or MCU, standing for "Microcontroller Units"), signal processing processors (or DSP, standing for "Digital Signal Processors"), Application-Specific Integrated Circuits (ASIC), programmable logic networks, particularly Field Programmable Gate Arrays (FPGA), thereby constituting the system hardware platform.

To this platform is added a set of software (generally real-time operating systems, including in particular a scheduler) developed for each software processor (CPU, MCU, DSP), and the configuration of hardware processors (ASIC, FPGA). All these constituents (hardware and software) once integrated (trend towards "System-on-Chip" systems) constitutes a complex system for which it is almost impossible to predict the behaviour in detail and some properties, such as their performance.

The design of complex systems is an activity upstream of implementation, integration and testing, which requires on the part of the engineers that they can predict very early the properties of the system to be developed so that all characteristics of the constituents can be decided upon.

With the growth in complexity and the reduction in development time, the designers must have design support tools (CAD) at their disposal. The technology of the disclosure meets this need.

Predicting the properties of such systems in terms of performance, in the general sense of the word, is the result of simulating abstract models that as closely as possible represent complex electronic systems that are able to combine hardware processors (FPGA, ASIC) and software processors (CPU, MCU, DSP). The very nature of current electronic systems and those of the future, which arise out of the integration of real-time software running on one or more processors themselves coupled with a complex and very varied hardware environment, means that rapid and high-performance simulation techniques have to be available, so that solutions can be verified and validated as efficiently and as early as possible during their design. For this reason, simulation techniques are very critical for the computer-assisted electronic design or "Electronic Design Automation" (EDA) industry.

BACKGROUND

A current means of being able to resolve the problem of predicting performance during the design of complex systems consists in constructing models of these systems upstream of development, and in doing so at increasingly high levels of abstraction. Starting with a purely behavioural model described by functional blocks and/or algorithms in C, C++, SystemC, the model is gradually enriched by temporal properties and by the description of the constituents of the hardware platform, so that research can be conducted into architectures and an analysis of their performance carried out.

The usual technique consists in using the C++/SystemC computer languages as a means for describing the system models at the so-called transactional abstraction level. Each model is developed rather in a manual way by direct writing of the C++ source code. The model for the architectural study is created by developing successive refinements or enrichments, which produces a complex model that requires considerable creation and verification time, before it can be used to extract results.

The current simulation technique for modelling the effect of a real-time executive (or operating system), which manages the sharing of the CPU resource and the scheduling of the tasks requiring the resource, is applied generally by direct use of the object (or machine) code of this real-time executive (or operating system). This simulation technique is known as native because the real-time executive (or operating system) code is executed directly on the simulation calculator. In this case, it is necessary to have available a model of the processor of the instruction set level, also known as an ISS ("Instruction Set Simulator") model. Another known native simulation solution consists in using a real-time executive (or operating system) simulator on a workstation of the PC or UNIX (trademark) type.

Moreover, the creation of an architectural model that combines the behaviour of the application with the behaviour of the complex system (including the real-time executives and/or operating systems) is a laborious task and one that is very costly in time terms. Therefore, any modification of the application or complex system requires development and verification time. The combined use of software processors (each running a real-time executive or operating system) and hardware processors (for example programmable and reconfigurable processors of the FPGA type) complicates model creation work still further. This difficulty seriously hampers investment by companies in such developments, which means that architectures are not explored and that, consequently, the performance of architectural choices is only discovered very late in the development cycle with a very significant risk of seeing constraints unmet.

A first major drawback of the known techniques is the considerable time and the significant skill required to develop such models given the manual development.

A second essential drawback of the known techniques stems from the fact that the model developed is monolithic in its construction, in other words the model contains all the aspects in a fully nested way: the functional model, the temporal properties, the processor components, the interconnections between these processors, the simulation model of a real-time executive or operating system for the hardware processors (CPU, MCU and DSP).

A third drawback is that simulation with an operating system (or real-time executive) requires the object code of this operating system (or real-time executive) and of the ISS model of the processor used as execution support to be available. A simulation technique of this kind is, on the one hand expensive since these constituents have to be paid for, on the other hand very slow (factor of 1000 relative to the technique of the disclosure), since the simulation is of the machine cycle ("cycle-accurate" or "cycle-approximate") level. Of course it is quite precise.

A fourth drawback of the known techniques is that the so-called native simulation technique (direct execution, on the simulation calculator, of the operating system or real-time executive code, or of an approximate model thereof (and therefore without an ISS model of the processor in the latter case)) exists only for a single level of tasks managed by a scheduler. The Applicant of the present application has this known technique at his disposal and it has been added to the SystemC 2.0 language. University teams such as TIMA, INPG of Grenoble and CECS, University of Irvine, CA, have a fairly similar technique at their disposal.

To the knowledge of the inventors of the present disclosure, there is not therefore today in existence any known technique of simulation by execution of models in native for a hierarchy of schedulers for processors (of the software, hardware, mechanical, human type etc). In other words, there is no known technique of simulation by execution of models for several executives or operating systems used hierarchically (a task managed by an executive or an operating system is itself an executive or an operating system) for tasks which it supports.

In fact, there is a need for this since more and more applications, particularly real-time ones, will be operating hierarchical scheduling. Modelling and simulating complex systems executing these applications will therefore probably become unavoidable. By way of example we may cite mobile phones that run a number of specialised nested operating systems, or the capacity of any software application run on an operating system (OS) based on UNIX (trade Mark) or Linux (trade Mark) and using the notions of tasks (processes) and light processes (threads) of these operating systems.

The drawbacks above lead to the situation whereby designers do not explore possible architectures for their systems, and do not do so for reasons of cost and due to lack of time, relying therefore more on their experience and even their intuition to decide on choices of architectures.

SUMMARY

A method is provided for simulating a complex system including at least one processor executing a set of functions under the control of a hierarchised set of schedulers. Said method includes a step of construction of an architectural model of the complex system including a hierarchised set of components, each of the components being an instance of an object class belonging to the group including:
  a first class, called "Processor" class, representing an abstract model of any processor included in the complex system, each instance of the "Processor" class being called modelled processor;
  a second class, called "Function" class, representing an abstract model of any function executed by the complex system, each instance of the "Function" class being called modelled function;
  a third class, called "Scheduler" class, representing an abstract model of any scheduler included in the complex system, each instance of the "Scheduler" class being called modelled scheduler and being responsible for managing components, modelled function(s) and/or other modelled scheduler(s), which are internal thereto;
  each instance being initialised with at least one attribute characterising its required behaviour.

The general principle of an embodiment of the invention therefore consists in constructing an architectural model of the complex system, structured in the form of a hierarchy of objects (modelled processors, modelled functions and modelled schedulers), including a hierarchy of modelled schedulers. Therefore, the source code of each scheduler is not necessary since it is modelled in an abstract way by a few parameters (detailed below). Nor is it necessary to have at ones disposal the ISS model of each software processor used as execution support.

This model structure allows a simulation technique of the native type, which is therefore very rapid since it consists in executing the model algorithms directly on the simulation engine.

This model structure is not restricted to modelling the software processors (CPU, MCU and DSP for example), but also allows the hardware processors (FPGA and ASIC for example), mechanical or human to be modelled. It will be recalled that hardware processors may use the technique of dynamic reconfiguration so that the hardware can be shared by several functions, and that in this case the functions need to be scheduled.

To advantage, the architectural model construction step is carried out in compliance with the following rules:
  a modelled processor may include one or more other modelled processors, a modelled processor not including any other modelled processor is called an elementary modelled processor;
  an elementary modelled processor includes, apart from its own modelled scheduler, at least one modelled function and/or at least one other modelled scheduler;

a modelled scheduler includes at least one modelled function and/or at least one other modelled scheduler;

a modelled function may include one or more other modelled functions.

Compliance with these rules allows an optimum architectural model to be constructed.

To advantage, the architectural model construction step includes the following steps:

generating a functional model of the complex system, including said modelled functions and communication channels between said modelled functions;

generating a hardware platform model of the complex system, including said modelled processor or processors and said modelled scheduler or schedulers;

mapping the functional model on the platform model, to obtain said architectural model of the complex system.

In this way, the architectural model produced by the technique of an embodiment of the invention is monolithic in respect of simulation (the functional and platform constituents are in the same model), but not in its construction. Indeed, its construction results from the judicious fusion of a platform model and a functional model which are totally independent, and therefore each easier to optimise separately.

As is explained in detail subsequently, it is possible to reduce as much as possible the manual development necessary to generate the functional model and the platform model. To this end the disclosure provides, in a particular embodiment, for the required models to be generated with a model generator, which the user informs with a graphical description of these models based on a few symbols, to which the application function algorithms in C are added. The properties of the constituents, particularly the temporal properties, are thus introduced automatically into the model produced.

Moreover, the generation technique according to an embodiment of the invention automatically introduces the executives necessary for the model, as a function of function mapping on the processors and on the required schedulers.

According to one advantageous characteristic, said functional model includes at least one pair of modelled functions, called source function and consumer function, linked by a communication channel, the source function generating messages intended for the consumer function which consumes them.

To advantage, the step of mapping the functional model on the platform model is carried out in compliance with the following rules:

a modelled function may be mapped on a modelled processor or a modelled scheduler;

two modelled functions linked by a communication channel and mapped on different modelled processors induce a communication interface in each of said modelled processors, said communication interfaces being assimilated with additional modelled functions to be scheduled;

a communication channel linking two modelled functions mapped on one and the same modelled processor is managed by the modelled schedulers managing said modelled functions.

Compliance with these rules allows an optimum architectural model to be constructed.

Preferably, each modelled function is initialised with at least one attribute belonging to the group including:

a time for executing said modelled function;

a priority for sharing the modelled processor executing said modelled function.

Preferably, each modelled processor is initialised with at least the following attribute: the type, hardware processor or software processor, of said modelled processor.

Preferably, each modelled scheduler is initialised with at least the following attributes: a scheduling policy and at least one associated time parameter.

Time parameters associated with a scheduling policy are taken to mean for example task switching times, a time for choosing the task to be performed by the scheduler, and a time slice period allowing a modelled processor to be shared for tasks of the same priority.

To advantage, said at least one processor belongs to the group including: microprocessors, microcontrollers, digital signal processors (DSP), network processors, application-specific integrated circuits (ASIC), programmable logic networks, particularly field programmable gate arrays (FPGA), mechanical processors and human processors.

To advantage, the method additionally includes a native simulation step including the following steps: obtaining a binary code of the architectural model, by compiling a source code of said architectural model, and direct execution of the binary code of the architectural model by a simulation engine.

In this way, the simulation technique of an embodiment of the invention is of the native type and therefore very rapid since it consists in executing the application algorithms directly, for example as a compiled C++ code, on the simulation calculator. The source code of each scheduler is not necessary. It is modelled in an abstract way by a few parameters, namely the task scheduling policy, the task switching times, the time for choosing the task to be performed by the scheduler.

To advantage, the step of direct execution of the binary code of the architectural model includes the following steps:

the simulation engine starts with the most containing component of said hierarchised set of components and descends into the modelled processors as far as the elementary modelled processor(s) not including a modelled processor;

for each elementary modelled processor:

the simulation engine analyses the status of the modelled functions and modelled schedulers located at the highest hierarchical level within said modelled processor;

as a function of a first scheduling policy with which a modelled scheduler associated with said elementary modelled processor has been initialised, the simulation engine selects the modelled function or the modelled scheduler with the highest priority within said modelled processor;

the simulation engine activates the component selected, by applying at least one time parameter associated with said first scheduling policy.

It will be noted that the very structure of the architectural model induces the simulation principle.

According to one advantageous characteristic, for each activated component which is a modelled scheduler:

the simulation engine analyses the status of all the modelled functions and all the modelled schedulers located at the highest hierarchical level within said activated modelled scheduler;

as a function of a second scheduling policy with which said activated modelled scheduler has been initialised, the simulation engine selects the modelled function or the modelled scheduler with the highest priority within said activated modelled scheduler;

the simulation engine activates the component selected, by applying at least one time parameter associated with said second scheduling policy.

An embodiment of the invention also relates to a computer program product including program code instructions for the execution of the steps in the aforementioned method according to the invention, when said program is run on a computer.

An embodiment of the invention also relates to storage means, which may possibly be fully or partially removable and may be read by a computer, storing a set of instructions that can be executed by said computer so as to implement the aforementioned method according to an embodiment of the invention.

BRIEF DESCRIPTION OF THE DRAWINGS

Other characteristics and advantages will emerge from reading the following description of one preferential embodiment of the invention, given purely by way of example and non-restrictively, and of the attended drawings, wherein.

DETAILED DESCRIPTION OF ILLUSTRATIVE EMBODIMENTS

The innovation therefore relates to a method for simulating a complex system including at least one processor executing a set of functions under the control of a hierarchised set of schedulers.

Figure 1:
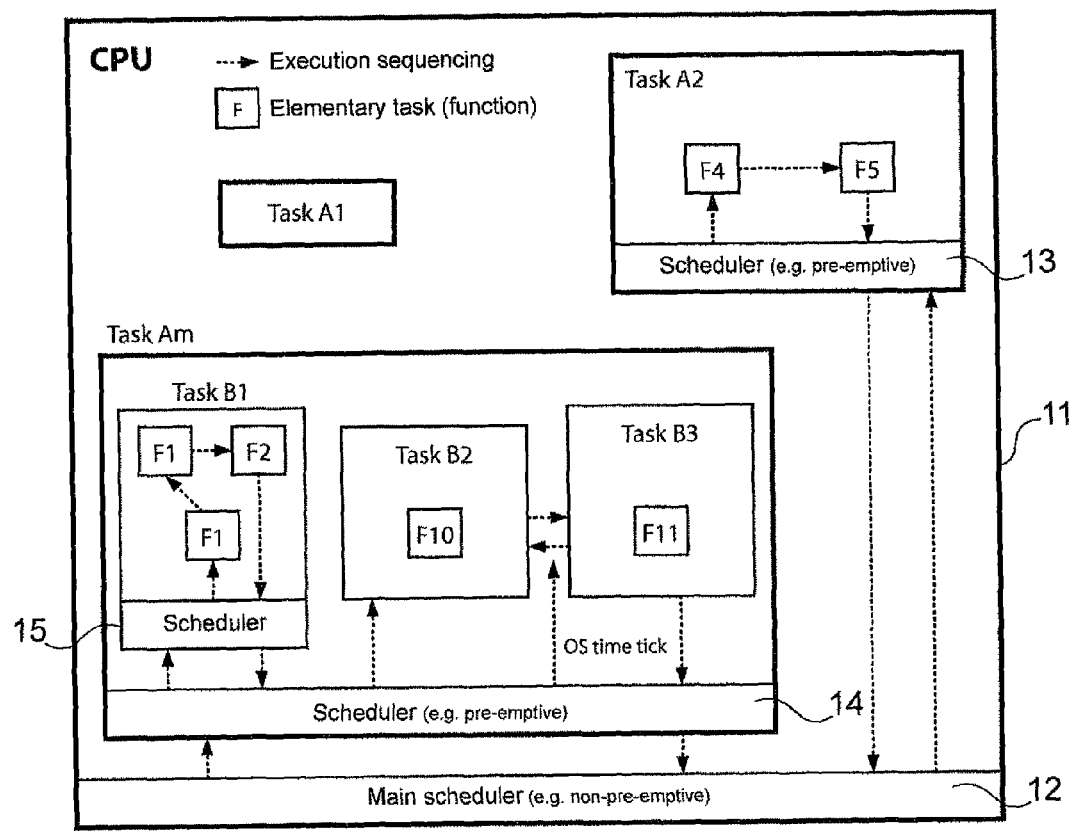
FIG. 1 shows an example of a complex system, reduced to a single processor, that may be subject to a simulation according to the method of an embodiment of the invention.

A complex system example will now be shown, in relation to FIG. 1, reduced to a single processor (CPU), which may be subject to a simulation according to the method of an embodiment of the invention.

The microprocessor (CPU) 11 is responsible for executing a set of first level tasks: Task A1, Task A2, to Task Am. A real-time executive (main scheduler, for example non-pre-emptive) 12 is added to this set of tasks to schedule CPU task execution sequencing.

In this example, Task A2 is in fact a group of two elementary tasks (also called functions): F4 and F5. A real-time executive (scheduler, for example pre-emptive) 13 is also associated with this group for the scheduling thereof.

Likewise, Task Am is in fact a group of three tasks: Task B1, Task B2, Task B3. A real-time executive (scheduler, for example pre-emptive) 14 is also associated with this group for the scheduling thereof.

The hierarchy may continue, which is shown for Task B1 which includes a group of three elementary tasks (functions) F1, F2, F3, and a real-time executive (scheduler) 15 is associated with this group.

Finally, in this example, Task B2 includes a single elementary task (function) F10 and Task B3 includes a single elementary task (function) F11.

As an illustration of real examples, a processor may support an initial set of real-time tasks managed by a real-time executive such as VxWorks (trademark) of the company Wind River Systems. One of the tasks is used to run the Linux (trademark) operating system which itself executes a set of tasks. Another task may be used to run the Java (trademark) virtual machine, itself being responsible for executing a set of tasks or threads. In the laptop field, a task is for example used to run the Symbian (trademark) operating system itself managing set of tasks.

Figure 2:
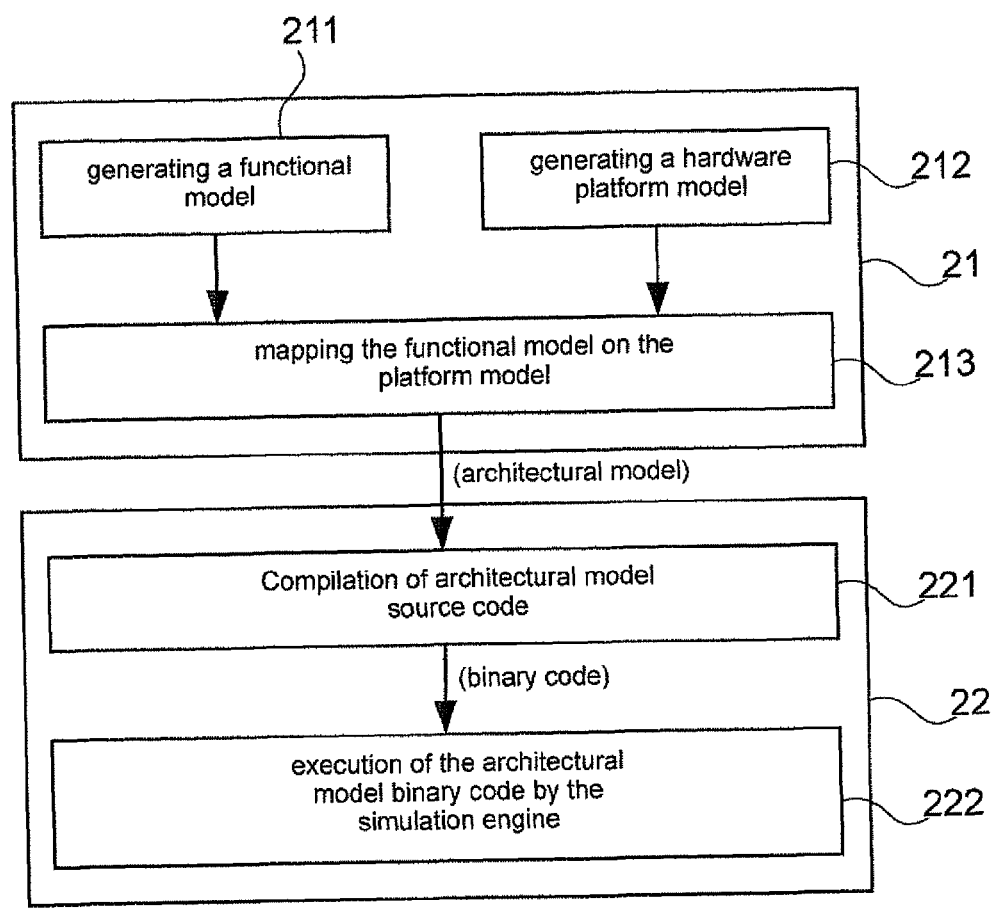
FIG. 2 shows a flow chart of one particular embodiment of the simulation method according to an embodiment of the invention.

As shown in FIG. 2, the simulation method according to an embodiment of the invention includes a step 21 of construction of an architectural model of the complex system and a step 22 of native simulation from this architectural model.

The general principle of an embodiment of the invention consists in constructing an architectural model including a hierarchy of components, each being an instance of an object class.

The object classes used are:
- a first class, called "Processor" class, representing an abstract model of any processor (hardware or software) included in the complex system, each instance of the "Processor" class being called modelled processor;
- a second class, called "Function" class, representing an abstract model of any function (elementary task) executed by the complex system, each instance of the "Function" class being called modelled function;
- a third class, called "Scheduler" class, representing an abstract model of any scheduler included in the complex system, each instance of the "Scheduler" class being called modelled scheduler and being responsible for managing components, modelled function(s) and/or other modelled scheduler(s), which are internal thereto.

Each instance is initialised with at least one attribute characterising its required behaviour (see details below).

The object classes are for example developed in SystemC 2.0. But the invention is not restricted to the use of this language.

Architectural model creation complies with the following rules:
- a modelled processor may include one or more other modelled processors, a modelled processor not including any other modelled processor is called an elementary modelled processor;
- an elementary modelled processor includes, apart from its own modelled scheduler (see the main scheduler 12 in FIG. 1), at least one modelled function and/or at least one other modelled scheduler;
- a modelled scheduler includes at least one modelled function and/or at least one other modelled scheduler;
- a modelled function may include one or more other modelled functions.

In the particular embodiment of the invention shown in FIG. 2, the step 21 of construction of an architectural model itself includes:
- a step 211 of generation of a functional model of the complex system, including the modelled functions and communication channels between these modelled functions;
- a step 212 of generation of a hardware platform model of the complex system, including the modelled processor or processors and the modelled scheduler or schedulers;
- a step 213 for mapping the functional model on the platform model, so as to obtain the architectural model of the complex system.

Furthermore, in this particular embodiment, the step 22 of native simulation itself includes a step 221 of obtaining a binary code of the architectural model, by compiling a source code of this architectural model, and a step 222 of direct execution of the binary code of the architectural model by a simulation engine. This latter step 222 is discussed in further detail in the remainder of the description.

Figure 3:
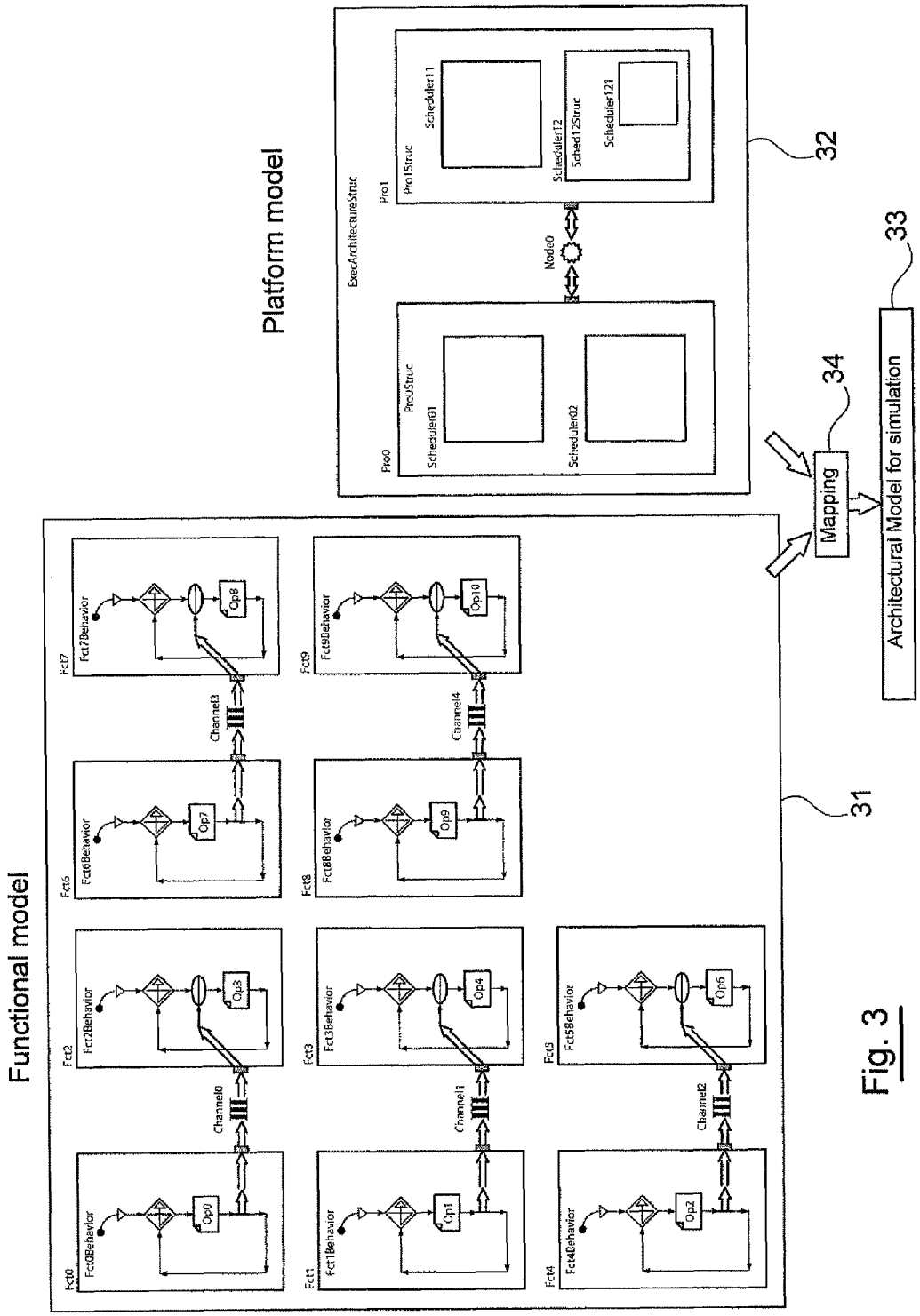
FIG. 3 shows through an example the step of construction of an architectural model that appears on the flow chart in FIG. 2, with the generation of a functional model and of a hardware platform model of the complex system, and a mapping of one of these two models on the other.

FIG. 3 shows through an example the step of construction of an architectural model appearing on the flow chart in FIG. 2, with the mapping of a functional model on a hardware platform model of the complex system, these two models being previously generated independently of each other.

A graphics editor is used for example to capture the functional model 31 and the hardware platform model 32, necessary as an input of the architectural model generating tool 33.

The left-hand part of FIG. 3 shows the example under consideration for the functional model 31. It is composed of simple modelled functions (possible hierarchy), referenced Fct0 to Fct9, and modelled communication channels (also called functional relations or message lists), referenced Channel0 to Channel4. The modelled functions are grouped in pairs: each left-hand modelled function (Fct0, Fct1, Fct4, Fct6, Fct8) is a generator of messages intended for the right-hand modelled function (Fct2, Fct3, Fct5, Fct7, Fct9) which consumes them.

The right-hand part of FIG. 3 shows a platform model example 32. It is composed of two modelled processors (possible hierarchy) referenced Pro0 and Pro1, and a modelled communication node, referenced Node0, representing the physical interconnection bus. The modelled processors may be of the hardware or software type. Each modelled processor includes several modelled schedulers: the modelled processor referenced Pro0 includes the modelled schedulers referenced Scheduler01 and Scheduler02. The modelled processor referenced Pro1 includes the modelled schedulers referenced scheduler11, Scheduler12 and Scheduler121. The hierarchy of modelled schedulers is considered in the example. Thus, the modelled scheduler referenced Scheduler121 is included in the one referenced Scheduler12.

Each model 31, 32 is enriched by properties known as attributes. These attributes, and particularly those of the platform model 32, are important for the generation of the architectural model 33. The essential attributes are:

for a modelled function: its execution times, its priority for sharing the modelled processor which executes this modelled function;

for a modelled processor: its type, i.e. hardware processor or software processor (running software, which is the case of microprocessors);

for a modelled scheduler: its scheduling policy and associated time parameters.

The operations for mapping 34 the functional model 31 on the platform model 32 is for example carried out interactively, with an adapted software tool (the functionalities of which are discussed below). This operation leads automatically to the architectural model 33 being obtained, allowing its performance to be evaluated and architectures to be explored.

Figure 4:
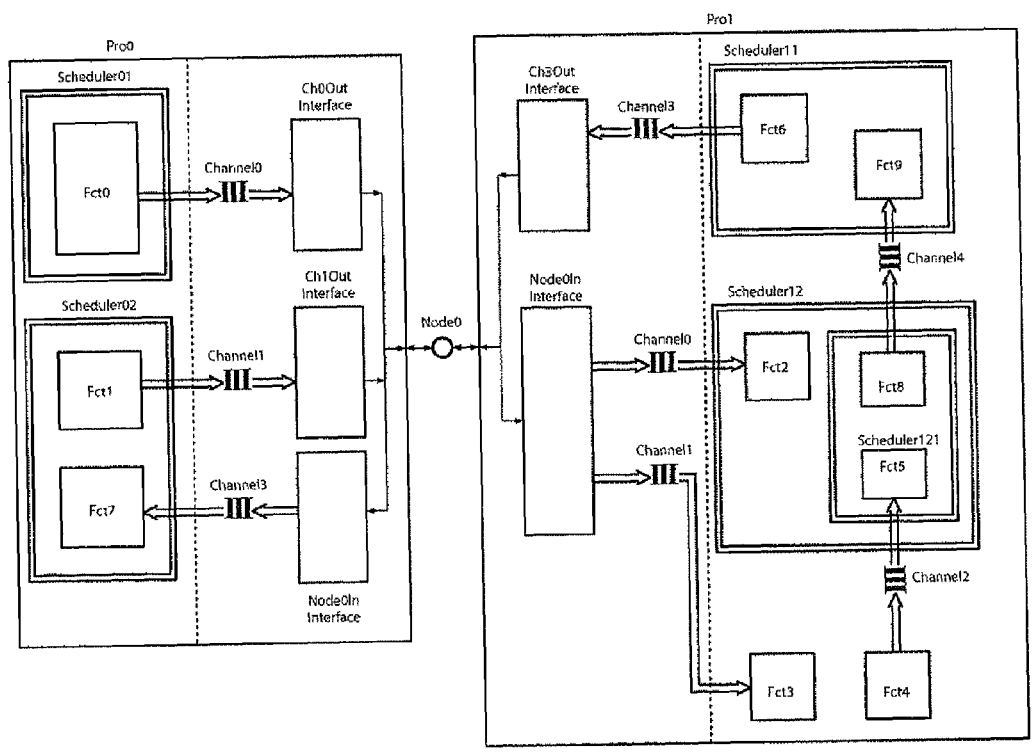
FIG. 4 shows an example of an architectural model, obtained at the end of the mapping shown in FIG. 3.

FIG. 4 shows an architectural model example, obtained after the mapping shown in FIG. 3.

The elements common to FIGS. 3 and 4 retain the same references (modelled processors referenced Pro0 and Pro1, modelled functions referenced Fct0 to Fct9, modelled communication channels referenced Channel0 to Channel4, schedulers referenced Scheduler01, Scheduler02, Scheduler11, Scheduler12 and Scheduler121).

The step of mapping 34 the functional model 31 on the platform model 32 is carried out in compliance with the following rules:

a modelled function may be mapped on a modelled processor (the case of modelled functions referenced Fct3 and Fct4) or a modelled scheduler (the case of the other modelled functions);

two modelled functions linked by a communication channel and mapped on different modelled processors (the case of the following pairs of functions: (Fct0, Fct2), (Fct1, Fct3), (Fct6, Fct7)) induce a communication interface in each of the modelled processors involved. These communication interfaces are assimilated with additional modelled functions for scheduling. They are referenced Ch0out Interface, Ch1out Interface, Ch3out Interface and Node0In Interface;

a communication channel linking two modelled functions mapped on one and the same modelled processor (the case of the channels referenced Channel2 and Channel4) is managed by the modelled schedulers managing these modelled functions.

In this example, the hierarchy of modelled schedulers is clearly shown for the modelled processor referenced Pro1, which is a software processor. Indeed, the latter possesses its own scheduler (not shown, and called above main scheduler), which manages the modelled functions referenced Fct3 and Fct4 and the two schedulers referenced Scheduler11 and Scheduler12. The scheduler referenced Scheduler12 itself manages the modelled function referenced Fct2 and the modelled scheduler referenced Scheduler121.

Figure 5:
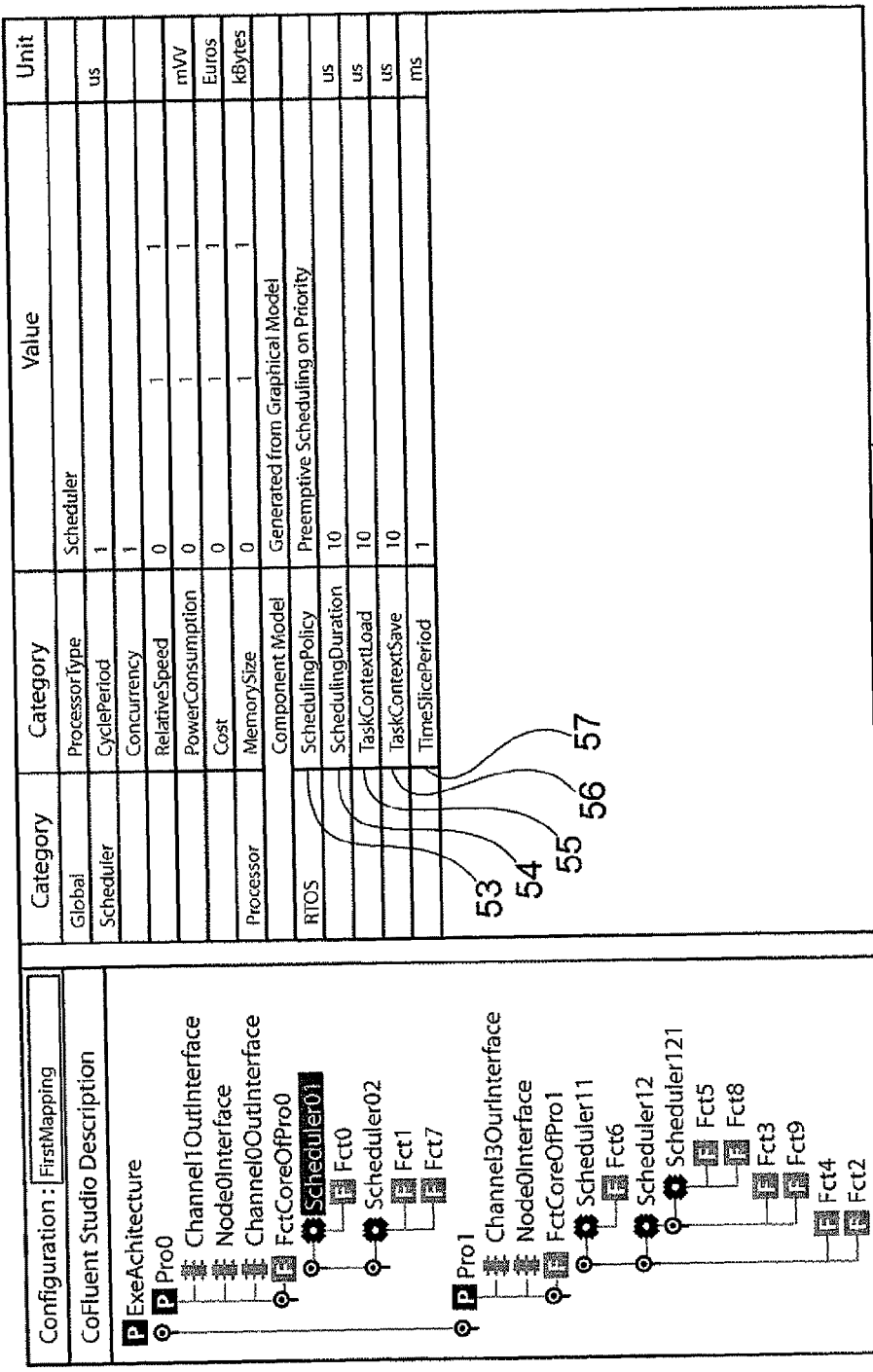
FIG. 5 shows an example of a software tool for editing the attributes of the components of an architectural model, through the example of the architectural model in FIG. 4.

An example will now be shown, in relation to FIG. 5, of a software tool for editing the architectural model component attributes, through the example of the architectural model in FIG. 4.

The left-hand window 51 displays the architectural model hierarchy (the names of the elements are identical to those in FIG. 4) and the element of this hierarchy currently selected (it appears in a greyed out frame) and the attributes of which may therefore be defined.

The right-hand window 52 displays the attributes of the element selected in the left-hand window 51. In the example shown, it is the scheduler referenced Scheduler01. The right-hand window 52 includes four columns, which indicate respectively, for each attribute: the category of attributes to which this attribute belongs, the name of this attribute, the value of this attribute and the unit in which this value is expressed.

Among the different attributes of a scheduler, the following, which characterise a Real-Time Operating System (RTOS) will in particular be noted:

a first attribute ("SchedulingPolicy") 53 which defines the policy for scheduling the tasks. The most usual ones are: scheduling by priority, by expiry, which can be done in pre-emptive or non-pre-emptive mode, operation of the time-sharing type;

a second attribute ("SchedulingDuration") 54 which represents the time required by the scheduler to decide on the task to be executed;

third and fourth attributes (("TaskContextLoad" and "TaskContextSave") 55 and 56 which represent the task switching times;

a fifth attribute ("TimeSlicePeriod") 57 which makes it possible, in respect of tasks of the same priority, to ensure processor sharing by allocation of time slices.

Schedulers may have different scheduling policies. Scheduling policies for a hardware processor are slightly different. In particular, the pre-emptive character does not today seem justified. The man skilled in the art will know how to define precisely the different scheduling policies that may be selected. The invention is not tied to any particular scheduling policy.

A particular embodiment will now be shown in more detail of the step (referenced 222 in FIG. 2) of direct execution of the binary code of the architectural model by a simulation engine.

The very structure of the architectural model in the form of a hierarchy of objects induces the simulation principle.

The simulation engine starts with the most containing component of the hierarchised set of components and goes down into the modelled processors as far as the elementary modelled processors (processors not including a modelled processor, but only modelled functions and/or modelled schedulers).

For each elementary modelled processor, the simulation engine analyses the status of the modelled functions and modelled schedulers located at the highest hierarchical level within this modelled processor. Each scheduler is considered as a task. Then, as a function of the scheduling policy of this modelled processor (or to be more precise of the main scheduler associated with this modelled processor), the simulation engine selects the modelled function or the modelled scheduler with the highest priority within this modelled processor. Finally, the simulation engine activates the selected component, by applying the time parameters ("SchedulingDuration" and "TaskContextLoad") associated with this scheduling policy.

If the activated component is a modelled scheduler, the simulation engine analyses the status of all the modelled functions and all the modelled schedulers located at the highest hierarchical level within this activated modelled scheduler. Then, as a function of the scheduling policy with which this activated modelled scheduler has been initialised, the simulation engine selects the modelled function or the modelled scheduler with the highest priority within this activated modelled scheduler. Finally, the simulation engine activates the selected component, by applying the time parameters associated with the scheduling policy followed by the activated modelled scheduler.

Recurrence is pursued in this way for the whole hierarchy down to the modelled functions (elementary tasks).

The complexity of the technique of an embodiment of the invention comes from the priority aspect of the processor or of a containing scheduler. A pre-emption must occur (external interruption, allocated and elapsed time slice, message availability etc). In this case, at the level of hierarchy where the event appears, the current task or scheduler is suspended and consequently for a scheduler all the tasks included are suspended recursively while respecting the time parameters ("TaskContextLoad"). The allocation is then considered by the level scheduler, which induces a relaunch for the descending hierarchy.

The technique of an embodiment of the invention, based on an object implantation, is open. This allows any future adaptation to new designer needs. Indeed, the scheduling algorithm is implanted as a method of the "Processor" class, and the modelled scheduler is a class inherited from the "Processor" class. The scheduling method can therefore at any time be overwritten by a method able to be described by the model designer to respond to a particular need thereof.

It should be noted that the invention is not restricted to processors of the microprocessor type. It applies similarly to hardware processors as represented for example by reconfigurable programmable circuits of the FPGA type. This is very important for the future. Indeed, programmable circuit reconfigurability leads to the possibility of sharing one and the same hardware zone (gates and bistables) for several functions or algorithms on condition they run exclusively. To provide for this requirement, a scheduler is therefore necessary. The scheduler is then hardware since it is internal to the FPGA.

It will be recalled that an embodiment of the invention allows simulation that is very high-performance, because it is native, of any hierarchy of real-time executives. The reasons for this performance are in particular:

simulation does not require the use of an Instruction Set Simulator of the processor. It is done by direct execution of the code (for example a compiled C code) by the simulation calculator (native execution);

simulation does however include the notion of execution time (so called "timed" simulation) as opposed to native "non-timed" simulations. This allows a study of solution performance to be conducted;

real-time executives are modelled by a few simple parameters (abstract RTOS model) as opposed to the need to have the source code of each executive at ones disposal.

The disclosure provides a technique for simulating a complex system including a scheduler hierarchy for one or more processors.

The disclosure, in at least one embodiment, provides a simulation technique of this kind, which applies whatever type, hardware, software, mechanical or human, of processor or processors is included in the complex system for simulation.

The disclosure, in at least one embodiment, provides a simulation technique of this kind, which is very fast to run and does not require the object code of the operating system (or of the real-time executive), and of the ISS model of each software processor used as execution support, to be available.

The disclosure, in at least one embodiment, provides a simulation technique of this kind, which allows the time and skills required to develop the model of the complex system for simulation to be reduced.

The disclosure, in at least one embodiment, provides a simulation technique of this kind, which allows a model of the complex system to be generated which is monolithic in its use but not in its construction.

Although the present disclosure has been described with reference to one or more examples, workers skilled in the art will recognize that changes may be made in form and detail without departing from the scope of the disclosure and/or the appended claims.

The invention claimed is:

1. Method for simulating a complex system including at least one processor executing a set of functions under the control of a hierarchized set of schedulers, wherein said method includes a step of constructing an architectural model of the complex system including a hierarchized set of components, each of the components being an instance of an object class belonging to the group including:

a first class, called "Processor" class, representing an abstract model of any processor included in the complex system, each instance of the "Processor" class being called modelled processor;

a second class, called "Function" class, representing an abstract model of any function executed by the complex system, each instance of the "Function" class being called modelled function;

a third class, called "Scheduler" class, representing an abstract model of any scheduler included in the complex system, each instance of the "Scheduler" class being called modelled scheduler and being responsible for managing components, modelled function(s) and/or other modelled scheduler(s), which are internal thereto;

each instance being initialized with at least one attribute characterizing its required behavior; and wherein the method additionally includes a native simulation step including the following steps: obtaining a binary code of the architectural model, by compiling a source code of said architectural model, and direct execution of the binary code of the architectural model by a simulation engine; and wherein the step of direct execution of the binary code of the architectural model includes the following steps:

the simulation engine starts with the most containing component of said hierarchized set of components and goes down into the modelled processors as far as the elementary modelled processor (s) not including a modelled processor;

for each elementary modelled processor:

the simulation engine analyses the status of the modelled functions and modeled schedulers located at the highest hierarchical level within said modelled processor;

as a function of a first scheduling policy with which a modelled scheduler associated with said elementary modelled processor has been initialized, the simulation engine selects the modelled function or the modelled scheduler with the highest priority within said modelled processor;

the simulation engine activates the component selected, by applying at least one time parameter associated with said first scheduling policy.

2. Method according to claim 1, wherein the step of constructing an architectural model is carried out in compliance with the following rules:

a modelled processor may include one or more other modelled processors, wherein a modelled processor not including any other modelled processor is called an elementary modelled processor;

an elementary modelled processor includes, apart from its own modelled scheduler, at least one modelled function and/or at least one other modelled scheduler;

a modelled scheduler includes at least one modelled function and/or at least one other modelled scheduler; and a modelled function may include one or more other modelled functions.

3. Method according to claim 1, wherein the step of constructing an architectural model includes the following steps:

generating a functional model of the complex system, including said modelled functions and communication channels between said modelled functions;

generating a hardware platform model of the complex system, including said modelled processor or processors and said modelled scheduler or schedulers;

mapping the functional model on the platform model, to obtain said architectural model of the complex system.

4. Method according to claim 3, wherein said functional model includes at least one pair of modelled functions, called source function and consumer function, linked by a communication channel, the source function generating messages intended for the consumer function which consumes them.

5. Method according to claim 3, wherein the step of mapping the functional model on the platform model is carried out in compliance with the following rules:

a modelled function may be mapped on a modelled processor or a modelled scheduler;

two modelled functions linked by a communication channel and mapped on different modelled processors induce a communication interface in each of said modelled processors, said communication interfaces being assimilated with additional modelled functions to be scheduled;

a communication channel linking two modelled functions mapped on one and the same modelled processor is managed by the modelled schedulers managing said modelled functions.

6. Method according to claim 1, wherein each modelled function is initialized with at least one attribute belonging to the group including:

a time for executing said modelled function;

a priority for sharing the modelled processor executing said modelled function.

7. Method according to claim 1, wherein each modelled processor is initialized with at least the following attribute: the type, hardware processor or software processor, of said modelled processor.

8. Method according to claim 1, wherein each modelled scheduler is initialized with at least the following attributes: a scheduling policy and at least one associated time parameter.

9. Method according to claim 1, wherein said at least one processor belongs to the group including: microprocessors, microcontrollers, digital signal processors, network processors, application-specific integrated circuits, programmable logic networks, particularly field programmable gate arrays, mechanical processors and human processors.

10. Method according to claim 1, wherein, for each activated component which is a modelled scheduler:

the simulation engine analyses the status of all the modelled functions and all the modelled schedulers located at the highest hierarchical level within said activated modelled scheduler;

as a function of a second scheduling policy with which said activated modelled scheduler has been initialized, the simulation engine selects the modelled function or the modelled scheduler with the highest priority within said activated modelled scheduler;

the simulation engine activates the component selected, by applying at least one time parameter associated with said second scheduling policy.

11. Computer program product comprising a computer readable storage medium and program code instructions stored thereon for the execution of the following steps when said program is run on a computer:

simulating a complex system including at least one processor executing a set of functions under the control of a hierarchized set of schedulers, including a step of constructing an architectural model of the complex system including a hierarchized set of components, each of the components being an instance of an object class belonging to the group including:

a first class, called "Processor" class, representing an abstract model of any processor included in the complex system, each instance of the "Processor" class being called modelled processor;

a second class, called "Function" class, representing an abstract model of any function executed by the complex system, each instance of the "Function" class being called modeled function;

a third class, called "Scheduler" class, representing an abstract model of any scheduler included in the complex system, each instance of the "Scheduler" class being called modelled scheduler and being responsible for managing components, modeled function(s) and/or other modelled scheduler(s), which are internal thereto;

each instance being initialized with at least one attribute characterizing its required behavior; and a native simulation step including the following steps: obtaining a binary code of the architectural model, by compiling a source code of said architectural model, and direct execution of the binary code of the architectural model by a simulation engine; and wherein the step of direct execution of the binary code of the architectural model includes the following steps:

the simulation engine starts with the most containing component of said hierarchized set of components and goes down into the modelled processors as far as the elementary modelled processor (s) not including a modelled processor;

for each elementary modelled processor:

the simulation engine analyses the status of the modelled functions and modeled schedulers located at the highest hierarchical level within said modelled processor;

as a function of a first scheduling policy with which a modelled scheduler associated with said elementary modelled processor has been initialized, the simulation engine selects the modelled function or the modelled scheduler with the highest priority within said modelled processor;

the simulation engine activates the component selected, by applying at least one time parameter associated with said first scheduling policy.

12. Storage means, storing a set of instructions that can be executed by said computer so as to implement the method comprising:

simulating a complex system including at least one processor executing a set of functions under the control of a hierarchized set of schedulers, including a step of constructing an architectural model of the complex system including a hierarchized set of components, each of the components being an instance of an object class belonging to the group including:

a first class, called "Processor" class, representing an abstract model of any processor included in the complex system, each instance of the "Processor" class being called modelled processor;

a second class, called "Function" class, representing an abstract model of any function executed by the complex system, each instance of the "Function" class being called modeled function;

a third class, called "Scheduler" class, representing an abstract model of any scheduler included in the complex system, each instance of the "Scheduler" class being called modelled scheduler and being responsible for managing components, modelled function(s) and/or other modeled scheduler(s), which are internal thereto;

each instance being initialized with at least one attribute characterizing its required behavior; and wherein the method additionally includes a native simulation step including the following steps: obtaining a binary code of the architectural model, by compiling a source code of said architectural model, and direct execution of the binary code of the architectural model by a simulation engine; and wherein the step of direct execution of the binary code of the architectural model includes the following steps:

the simulation engine starts with the most containing component of said hierarchized set of components and goes down into the modelled processors as far as the elementary modelled processor (s) not including a modelled processor;

for each elementary modelled processor:

the simulation engine analyses the status of the modelled functions and modeled schedulers located at the highest hierarchical level within said modelled processor;

as a function of a first scheduling policy with which a modelled scheduler associated with said elementary modelled processor has been initialized, the simulation engine selects the modelled function or the modelled scheduler with the highest priority within said modelled processor;

the simulation engine activates the component selected, by applying at least one time parameter associated with said first scheduling policy.

* * * * *